United States Patent [19]
Ishikawa

[11] Patent Number: 5,151,612
[45] Date of Patent: Sep. 29, 1992

[54] CIRCUIT FOR ELIMINATING DIGITAL NOISE OR SHORT PULSES UTILIZING SET/RESET SHIFT REGISTER

[75] Inventor: Masahiro Ishikawa, Yokohama, Japan

[73] Assignee: Nissan Motor Co., Ltd., Yokohama, Japan

[21] Appl. No.: 527,442

[22] Filed: May 23, 1990

[30] Foreign Application Priority Data

Jun. 22, 1989 [JP] Japan .................. 1-158188

[51] Int. Cl.⁵ .................. H03K 5/22; H03K 5/00
[52] U.S. Cl. .................. 307/234; 307/520; 307/542; 307/272.2; 328/111
[58] Field of Search .............. 307/520, 452, 481, 279, 307/443, 542, 272.1, 272.2, 272.3, 234, 542.1, 247.1, 480; 377/74, 117, 71, 72, 73, 78, 111, 79; 328/111

[56] References Cited

U.S. PATENT DOCUMENTS

| | | | |
|---|---|---|---|
| 3,786,276 | 1/1974 | Rosch | 307/272.2 X |
| 3,978,413 | 8/1976 | Frohwerk | 377/72 |
| 3,993,957 | 11/1976 | Davenport | 307/480 X |
| 4,250,406 | 2/1981 | Alaspa | 377/79 X |
| 4,320,525 | 3/1982 | Woodward | 307/480 X |
| 4,525,635 | 6/1985 | Gillberg | 307/542 X |
| 4,554,467 | 11/1985 | Vaughn | 307/279 |
| 4,612,659 | 9/1986 | Starke | 377/72 |
| 4,775,840 | 10/1988 | Ohmori et al. | 307/520 X |
| 4,843,254 | 6/1989 | Motegi et al. | 377/117 X |
| 4,929,850 | 5/1990 | Breuninger | 307/272.1 |
| 4,985,905 | 1/1991 | Kubinec | 377/72 X |
| 5,001,374 | 3/1991 | Chang | 307/520 X |

FOREIGN PATENT DOCUMENTS

| | | | |
|---|---|---|---|
| 0097413 | 8/1979 | Japan | 307/471 |
| 61-7718 | 1/1986 | Japan . | |
| 61-75637 | 5/1986 | Japan . | |
| 0154217 | 7/1986 | Japan | 307/471 |
| 0122207 | 5/1989 | Japan | 307/471 |

Primary Examiner—Stanley D. Miller
Assistant Examiner—Toan Tran
Attorney, Agent, or Firm—Foley & Lardner

[57] ABSTRACT

A digital noise eliminator whose noise elimination time (noise pulse width or noise frequency) can be determined by the shift time of a shift register activated in response to a reference clock comprises a shift circuit for transmitting an input signal at a second time of the up-edge of the clock as an output signal, only when at least two up-edges of the clock are included in the single input signal, after the input signal has been inputted, and for eliminating noise when only one up-edge of the clock is included in the single input signal; a setting circuit for setting the shift circuit when the input and output signal levels are both at high level; and a reset circuit for resetting the shift circuit when the input and output signal levels are both at low level.

6 Claims, 7 Drawing Sheets

ELIM max : MAX PULSE ELIMINATE TIME
PASS min : MIN PULSE PASS TIME

SINGLE SHIFT REGISTER

TWO SHIFT REGISTERS

THREE SHIFT REGISTERS

CIRCUIT FOR ELIMINATING DIGITAL NOISE OR SHORT PULSES UTILIZING SET/RESET SHIFT REGISTER

BACKGROUND OF THE INVENTION

1. Field of the Invention

The present invention relates to a digital noise eliminator for eliminating pulsed noise signals beyond a predetermined frequency or below a predetermined period, and more specifically to a digital noise eliminator whose noise elimination time (noise pulse width or noise pulse frequency) can be determined by a shift time of a shift register activated in response to a reference clock. The noise eliminator is suitable for use for a multichannel communications system mounted on automotive vehicles, for instance.

2. Description of the Prior Art

An example of prior-art digital noise eliminators is disclosed in Japanese Published Unexamined (Kokai) Patent Application No. 61-7718, which is suitable for use to eliminate noise superimposed upon a synchronizing signal of a TV set, as shown in FIG. 1(A).

This prior-art noise eliminator includes a flip-flop 2, an AND gate 4, a counter flip-flop 6, a one-shot multivibrator composed of two NOR gates 8 and 12, an inverter 14, and another AND gate 10, and operates according to the timing chart shown in FIG. 1(B). In more detail, the above one-shot multivibrator generates a one shot pulse OUT with a pulse width t in response to an up-edge of an input signal $Q_n$. In order to prevent the multivibrator gates 8 and 12 from being activated in response to noise, the counter flip-flop 6 counts output signals of the AND gate 4 only when the input signal IN is at "1" and the output signal OUT is at "0", and a one-shot pulse is generated at a time when the counter 6 counts a predetermined number of the AND gate output signals. In this prior-art circuit however, although noise A generated when the output signal is at "0" as shown in FIG. 1(C) can be eliminated, it is impossible to eliminate noise B generated when the output signal is at "1" as shown in FIG. 1(C).

Therefore, under the environment where various noises are always generated due to interference between one signal harness and the other signal harness, for instance, such as within an automotive vehicle, there still exists a problem in that it is difficult to eliminate noise sufficiently.

Another example of prior-art digital noise eliminator is disclosed in Japanese Published Unexamined (Kokai) Utility Model Application No. 61-75637, as shown in FIGS. 2(A) and (B), which can eliminate input signals having frequencies more than a predetermined value.

In FIG. 2(A), this noise eliminator 1 includes a P-channel MOS FET 3, an N-channel MOS FET 5, an inverter 17, a NAND gate 19, a NOR gate 21, another P-channel MOS FET 23, another N-channel MOS FET 25, a capacitor 11 and another inverter 13. Further, in FIG. 2(A) the reference numeral 7 denotes an input terminal, 15 denotes an output terminal, and 9 denotes a supply voltage terminal.

The operation of the circuit shown in FIG. 2(A) will be described hereinbelow with reference to FIG. 2(B). When an input signal changes from a low-voltage level ("L") to a high-voltage level ("H"), since the N-MOS FET 5 is turned on, the capacitor 11 is discharged via the N-MOS FET 5, so that the voltage level at node 26 gradually drops as shown. In this case, when the H-level of the input signal is wide enough and therefore the voltage level at node 26 drops down to a threshold 30 of the NOR gate 21, since the N-MOS FET 25 is further turned on, the capacitor 11 is discharged immediately down to "L", so that the output terminal changes to "H" normally via the inverter 13. However, when the input signal changes from "H" to "L" abnormally due to noise before the voltage level at node 26 reaches the threshold 30 of the NOR gate 21, since the P-MOS FET 3 is turned on, the capacitor 11 is charged immediately, so that the output terminal 15 changes to "L" via the inverter 13.

In contrast, when the input signal changes from "H" to "L", since the P-MOS FET 3 is turned on, the capacitor 11 is changed via the P-MOS FET 3, so that the voltage level at node 26 rises as shown. In this case, the L-level of the input signal is wide enough and therefore the voltage level at node 26 rises up to a threshold 31 of the NAND gate 19, since the P-MOS FET 23 is simultaneously turned on, the capacitor 11 is changes immediately up to "H", so that the output terminal changes to "L" normally via the inverter 13. However, when the input signal changes from "L" to "H" abnormally due to noise before the voltage level at node 26 reaches the threshold 31 of the NAND gate 19, since the N-MOS FET 25 is turned on, the capacitor 11 is discharged immediately, so that the output terminal 15 changes to "H" via the inverter 13.

In the above-mentioned prior-art circuit, therefore, it is possible to eliminate a noise pulse having a pulse width shorter than that determined on the basis of a time constant of the discharging circuit composed of the capacitor 11 and the N-MOS FET 5 or the charging circuit composed of the capacitor 11 and the P-MOS FET 3, irrespective of "H" or "L" level signals.

In the above-mentioned second prior-art noise eliminator, however, since the noise eliminating time period (or the eliminatable noise pulse width or frequency) is determined by the time constants (variation) in the manufacturing process and further temperature and voltage fluctuations. Therefore, there exists a problem in that the noise eliminating effect is not sufficient when the difference in frequency or period between the normal pulse and noise is small. In addition, when a long noise eliminating time period is required, since the long time-constant transistors and the large capacitors increase in volume, there exists another problem in that the IC chip volume increases and therefore the cost thereof is high when the prior-art circuit is integrated into a single IC chip.

SUMMARY OF THE INVENTION

With these problems in mind therefore, it is the primary object of the present invention to provide a digital noise eliminator which is stable and in which it is easy to determine the noise eliminating time period, without being subjected to the influence of element characteristic variation in manufacturing process and temperature and voltage fluctuations, which is effective when the difference in frequency or period between the normal pulse and noise is small, and which is small in IC chip volume and therefore low in cost.

To achieve the above-mentioned object, the digital noise eliminator according to the present invention comprises: (a) shift means responsive to an input signal IN and at least one clock CK, for transmitting the input signal, only when N-occurrences (N≧2) of edges of the clock are included in the same state period of the input signal, at an N-th edge timing of the clock as an output signal OUT, and for eliminating the input signal, when only (N−1) occurrences of edges of the clock are included in the same state period of the input signal, as a noise signal; (b) set means responsive to the input signal and the output signal, for setting the shift means when the input and output signal levels are both at a first signal voltage level; and (c) reset means responsive to the input signal and the output signal, for resetting the shift means when the input and output signal levels are both at a second signal voltage level.

If N=2, the digital noise eliminator according to the present invention comprises: (a) shift means responsive to an input signal IN and at least one clock CK, for transmitting the input signal, only when two up-edges of the clock are included in the single input signal, at a second up-edge time of the clock as an output signal OUT, and for eliminating the input signal, when only one up-edge of the clock is included in the single input signal, as a noise signal; (b) set means responsive to the input signal and the output signal, for setting the shift means when the input and output signal levels are both at a first binary signal voltage level; and (c) reset means responsive to the input signal and the output signal, for resetting the shift means when the input and output signal levels are both at a second binary signal voltage level.

In the first embodiment of the present invention, the shift means comprises: (a) a first D flip-flop circuit (201) responsive to the input signal IN, the clock $CK_s$, the set means and the reset means, for transmitting the input signal at a first up-edge time of the clock as a first output signal OUT 1, after the input signal has been inputted thereto; and (b) a second D flip-flop circuit (202) responsive to the first D flip-flop circuit, said set means and the reset means, for transmitting the first output signal OUT 1 outputted by said first D flip-flop circuit at a first up-edge time of the clock as an output signal OUT 2, after the first output signal OUT 1 has been inputted thereto. The set means is an AND gate (203) having two input terminals responsive to the input signa IN and the output signal OUT 2 and an output terminal connected to the set terminals of said two first and second D flip-flop means. The reset means is a NOR gate (204) having two input terminals responsive to the input signal IN and the output signal OUT 2 and an output terminal connected to the two reset terminals of said two first and second D flip-flop means. In the first embodiment, an input signal IN having a pulse width wider than a double period of the clock can be transmitted; an input signal IN having a pulse width narrower than a period of the clock can be eliminated; and an input signal IN having a pulse width between a double period and a single period of the clock are transmitted or eliminated according to a difference in timing between the input signal IN and the clock CK.

In the second embodiment of the present invention, the shift means comprises: (a) a first transmission gate (105) responsive to the input signal IN and a first clock CK1 and turned on in response to the first clock CK1; (b) a second transmission gate (106) responsive to the input signal IN and a second clock CK2 and turned on in response to the second clock CK2 delayed from the first clock; and (c) a shift inverter (113) connected between said first and second transmission gates, for inverting a binary signal level of a signal inputted thereto. The set means comprises; (a) an input-side inverter (104) responsive to the input signal, for inverting an input signal level; (b) a first switching element (110) having an output terminal connected between the first transmission gate and the shift inverter and turned on in response to a binary voltage level of the input signal IN inverted via the input-side inverter; and (c) a second switching element (109) connected between said first switching element and a supply voltage and turned on in response to the same first binary voltage level of the input signal inverted via the shift inverter when both the two transmission gates are turned on in response to the first and second clocks simultaneously, the first and second switching means setting an output terminal (117) of said first transmission gate at a high-voltage level when both are turned on. The reset means comprises; (a) a third switching element (111) having an output terminal connected between the first transmission gate and the shift inverter and turned on in response to a second binary voltage level of the input signal IN inverted via the input-side inverter; and (b) a fourth switching element (112) connected between said third switching element and ground and turned on in response to the same second binary voltage level of the input signal inverted via the shift inverter when the two transmission gates are both turned on in response to the first and second clocks simultaneously, the third and fourth switching means resetting the output terminal (117) of the first transmission gate at a low-voltage level when both are turned on. In the second embodiment, an input signal IN having a pulse width wider than the time between a down-edge of the first clock CK1 and a second-occurrence up-edge of the second clock CK2 can be transmitted; an input signal IN having a pulse width narrower than the time between a down-edge of the first clock CK1 and a first-occurrence up-edge of the second clock CK2 can be eliminated; and an input signal IN having a pulse width between the two up-edges of the second clocks CK2 are transmitted or eliminated according to a difference in timing between the input signal IN and the two clocks CK1 and CK2.

In the noise eliminator according to the present invention, since the noise elimination time or noise pulse width or frequency can be determined in dependence upon shift timing of at least one shift register in response to a reference clock, it is possible to accurately determine the noise elimination time on the basis of the reference clock. Further, when the noise eliminator is formed into the so-called dynamic type digital circuit, it is possible to minimize the IC volume, when the noise eliminators are incorporated together with other circuits.

DETAILED DESCRIPTION OF THE PREFERRED EMBODIMENTS

Figure 1:
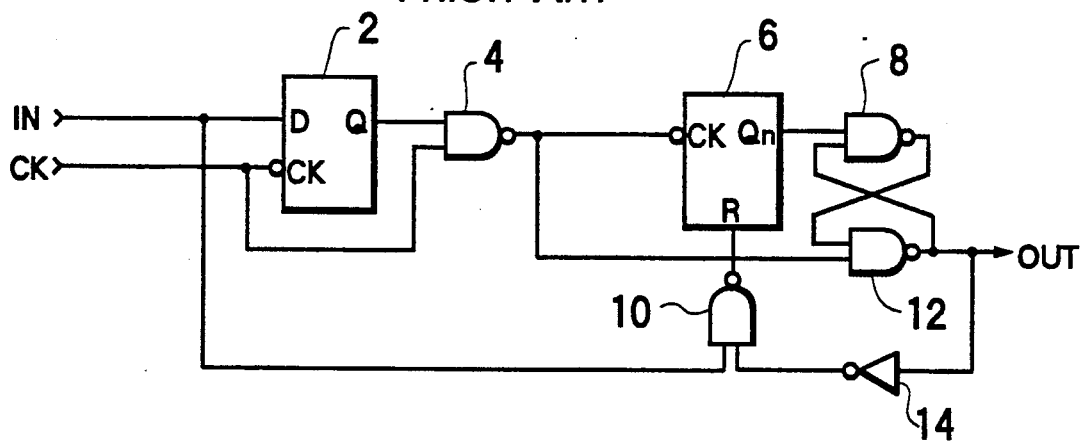
FIG. 1(A) is a circuit diagram showing a first example of prior-art digital noise eliminators.
FIG. 1(B) is a timing chart for assistance in explaining the operation of the noise eliminator shown in FIG. 1(A)
FIG. 1(C) is a timing chart for assistance in explaining a problem involved in the noise eliminator shown in FIG. 1(A)
Figure 1:
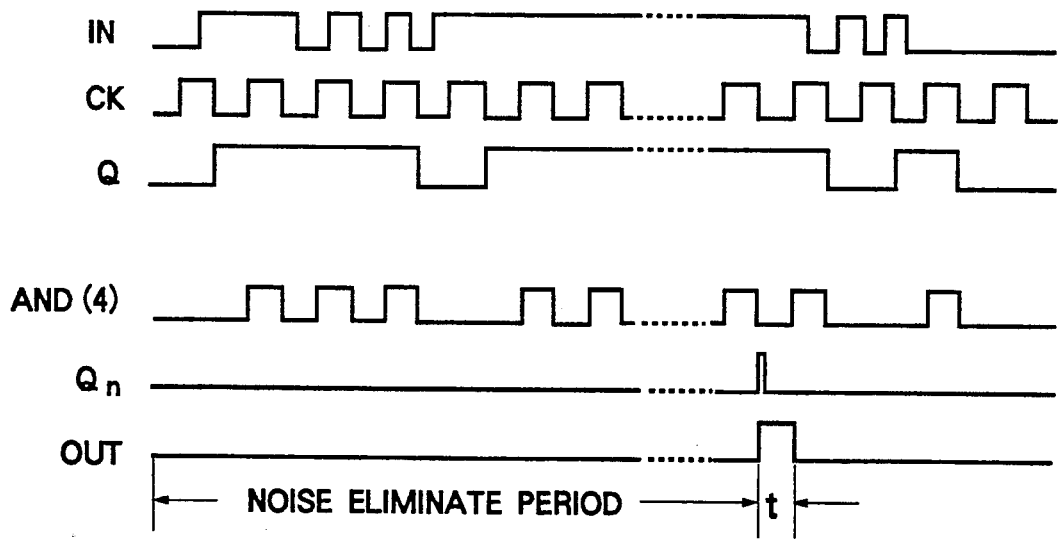
Figure 1:
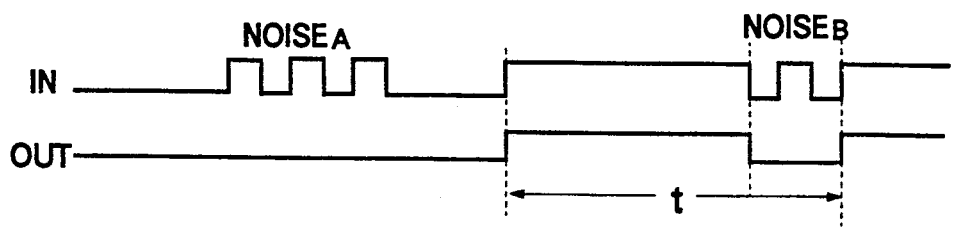
Figure 2:
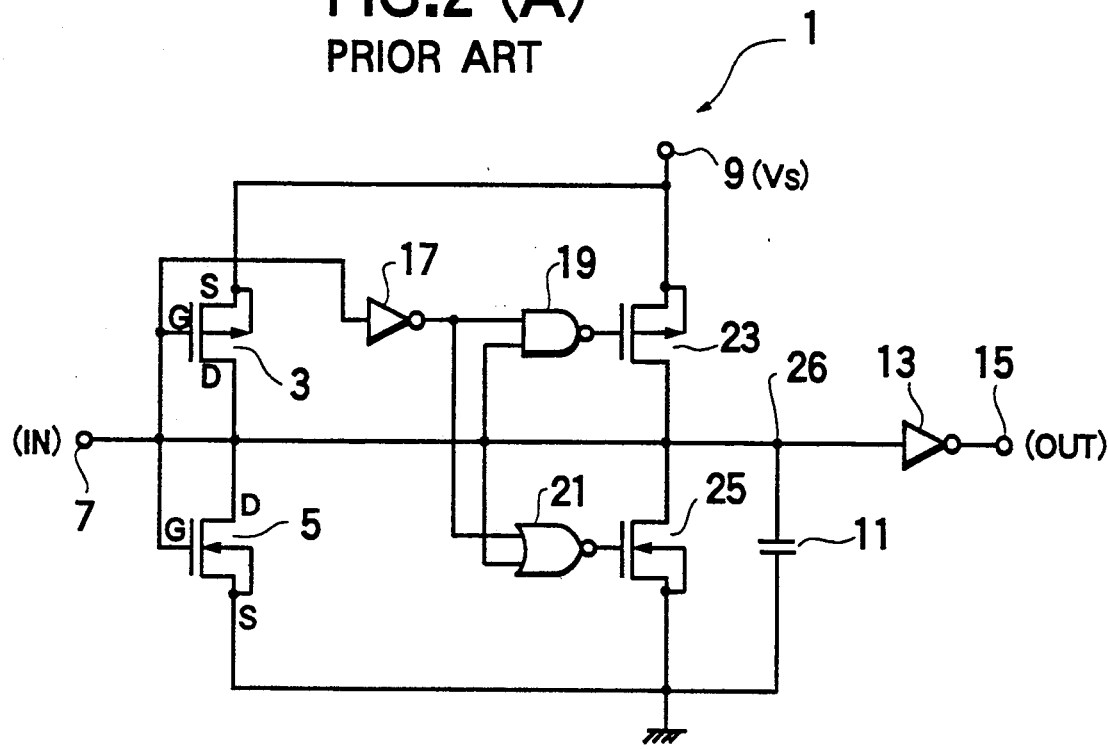
FIG. 2(A) is a circuit diagram showing a second example of prior-art digital noise eliminators.
FIG. 2(B) is a timing chart for assistance in explaining the noise eliminating operation of the circuit shown in FIG. 2(A)
Figure 2:
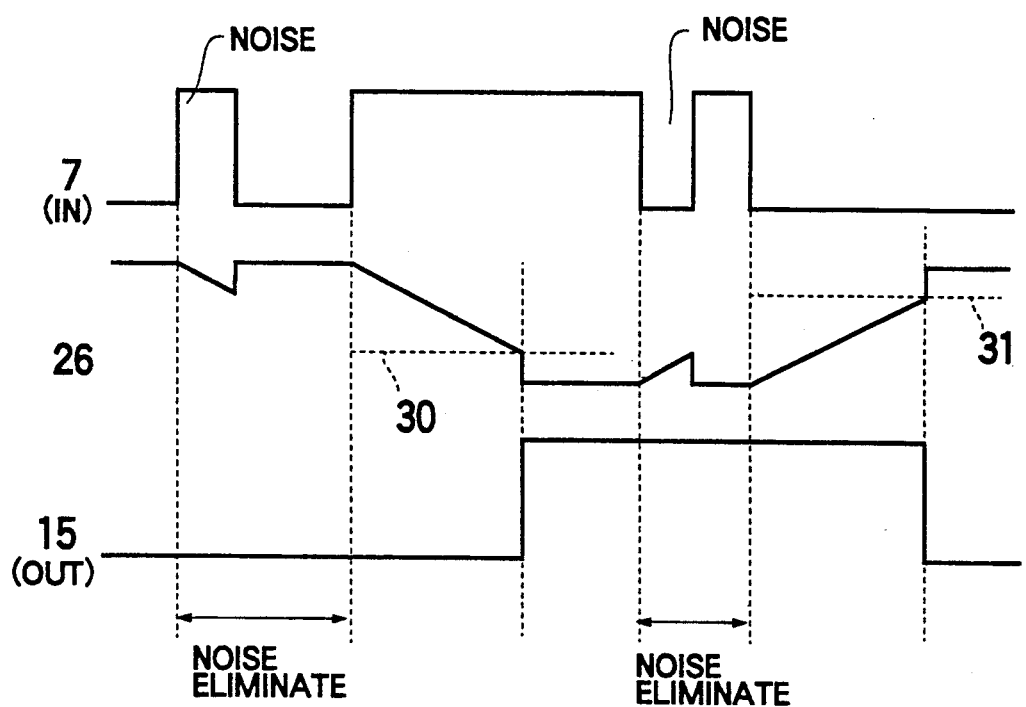
Figure 3:
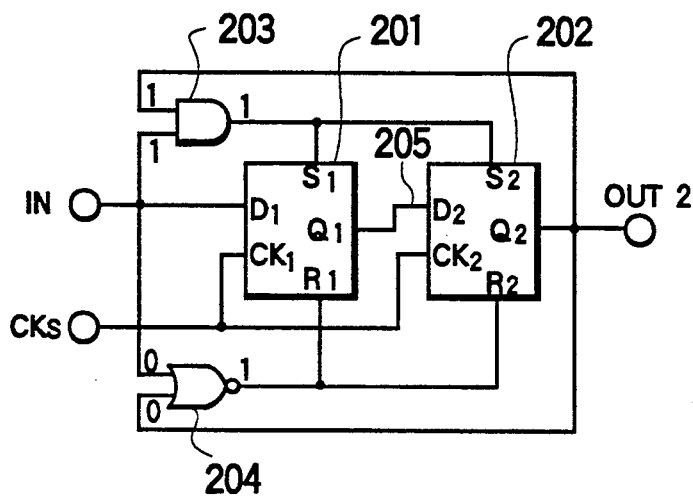
FIG. 3(A) is a circuit diagram showing a first embodiment of the digital noise eliminator according to the present invention.
FIG. 3(B) is a timing chart for assistance in explaining the noise eliminating operation of the circuit shown in FIG. 3(A)
Figure 3:
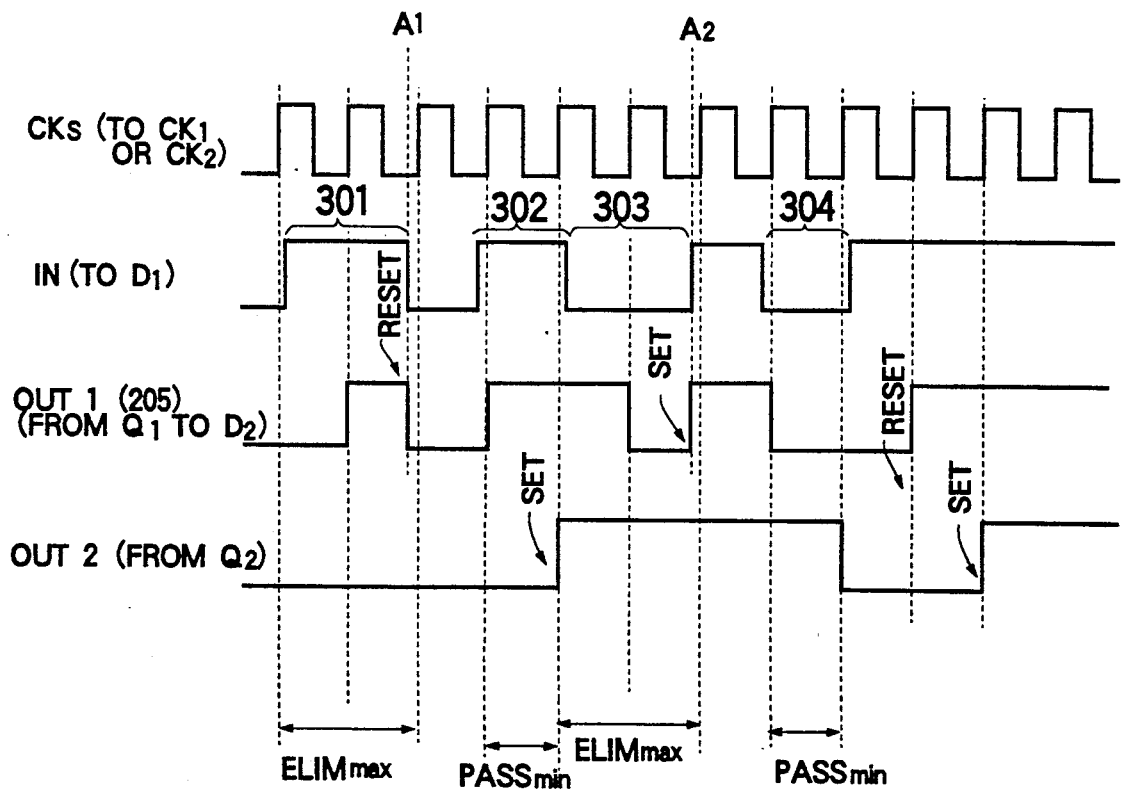

With reference to the attached drawings, embodiments of the present invention will be described hereinbelow. FIG. 3(A) shows a first embodiment configured by a static-operation shift register according to the present invention. Here, static operation implies that in a digital circuit such that the internal and output digital levels are changing in response to an input signal level, when the input signal stops, the internal and output digital levels are held or stored at the preceding levels. The noise eliminator shown in FIG. 3(A) is composed of a shift register including two D flip-flop circuits (referred to as D-FF, hereinafter).

In more detail, the noise eliminator comprises a first (master) D-FF 201, a second (slave) D-FF 202, an AND gate 203, and a NOR gate 204. The D-FF has an input terminal D, a clock terminal CK, an output terminal Q, a set terminal S, and a reset terminal R. In the first D-FF 201, an input signal IN applied to the input terminal $D_1$ is outputted from the output terminal $Q_1$ (205) as a first output signal OUT 1, in response to a shift clock $CK_s$ applied to the clock terminal $CK_1$, being delayed or shifted by one bit time (one period at the maximum) of the shift clock $CK_s$. In other words, it is possible to define the operation of D-FF as follows: The input signal (IN) level is held as the output signal (OUT 1) level when an up-edge of the shift clock $CK_s$ rises, and this held output signal (OUT 1) level will not change, irrespective of the change in input signal (IN) level, until the succeeding up-edge of the shift clock $CK_s$ rises and therefore the succeeding input signal (IN) level is held as the succeeding output signal (OUT 1) level, as depicted in FIG. 3(B).

In the same way, in the second D-FF 202, the first output signal OUT 1 (205) applied to the input terminal $D_2$ is outputted from the output terminal $Q_2$ as a second output signal OUT 2, in response to the same shift clock $CK_s$ applied to the clock terminal $CK_2$, being delayed or shifted by one bit time of the shift clock $CK_s$. Further, the first and second D-FFs 201 and 202 are set to "1" in response to an ANDed signal obtained through an AND gate 203 responsive to the input signal IN and the second output signal OUT 2, and reset to "0" in response to a NORed output signal obtained through a NOR gate 204 responsive to the input signal IN and the second output signal OUT 2.

With reference to FIG. 3(B), the operation of the static noise eliminator shown in FIG. 3(A) will be described. In the noise eliminator composed of the two D-FFs 201 and 202, since the input signal IN is delayed by one bit time by one D-FF, it is possible to pass a signal having a pulse width wider than a double period $ELIM_{max}$ of the shift clock $CK_s$ but to eliminate a signal having a pulse width narrower than a period $PASS_{min}$ of the shift clock $CK_s$. In other words, a signal having a frequency lower than a half frequency of the shift clock $CK_s$ can be passed but a signal having a frequency higher than that of the shift clock $CK_s$ can be eliminated.

Figure 4:
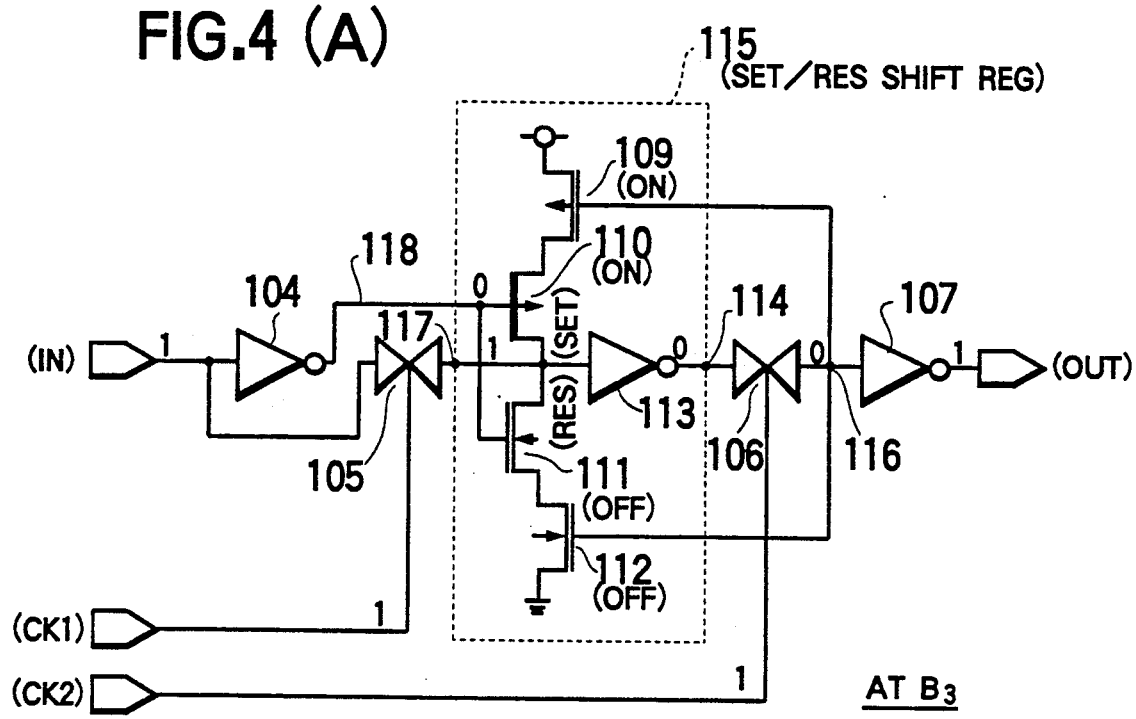
FIG. 4(A) is a circuit diagram showing a second embodiment of the digital noise eliminator according to the present invention.
FIG. 4(B) is a timing chart for assistance in explaining the noise eliminating operation of the circuit shown in FIG. 4(A)
FIG. 4(C) is a diagram showing the relationship between the input pulse width and the signal pass/eliminate operation in the second embodiment shown in FIG. 4(A)
FIG. 4(D) is a timing chart for assistance in explaining a reduction of the unstable elimination range in dependence upon two clocks.
FIG. 4(E) is an example of two-clock generators incorporated in the noise eliminator shown in FIG. 4(A)
Figure 4:
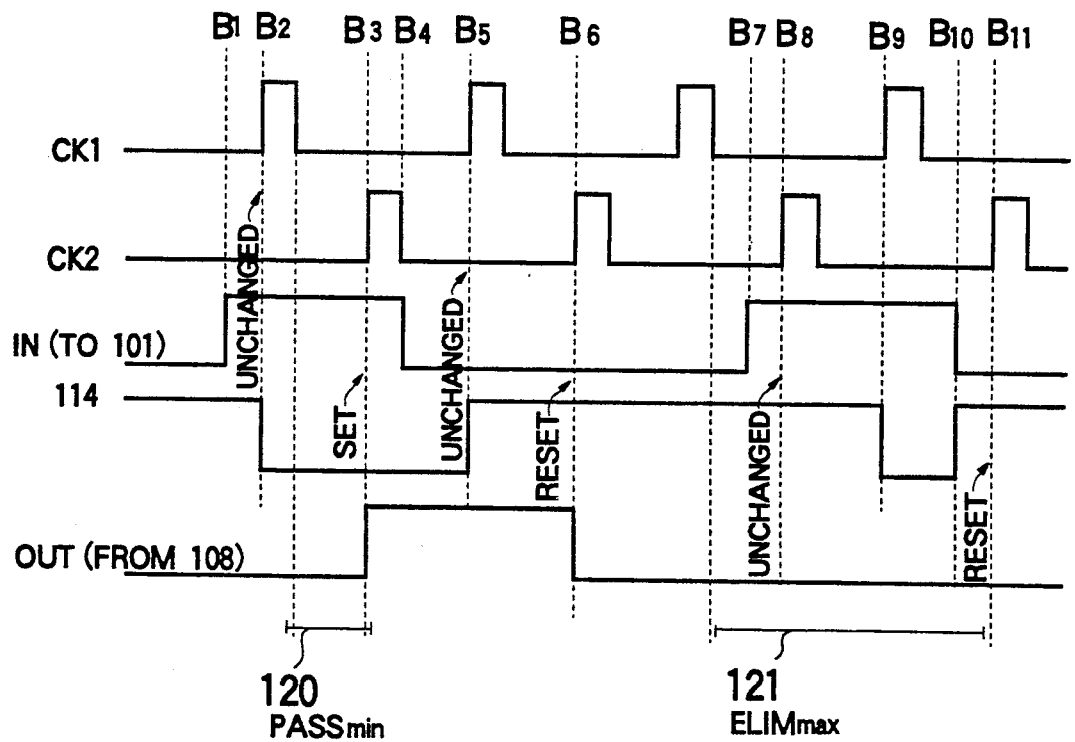
Figure 4:
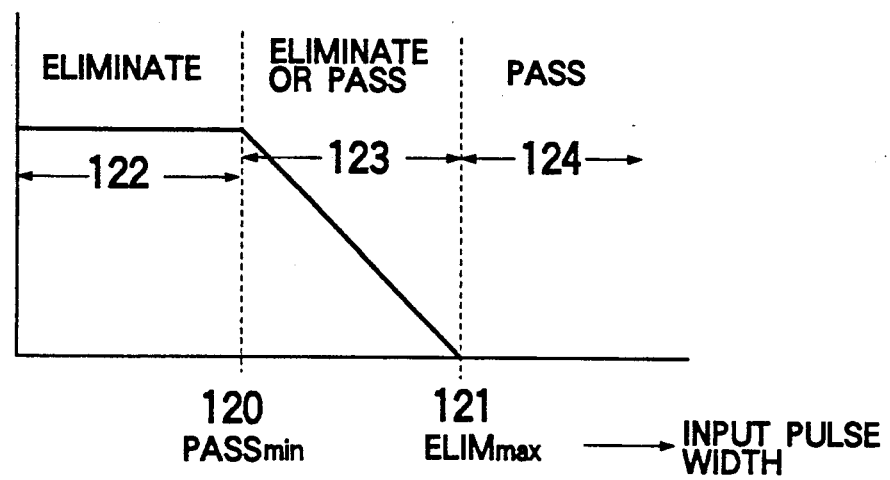
Figure 4:
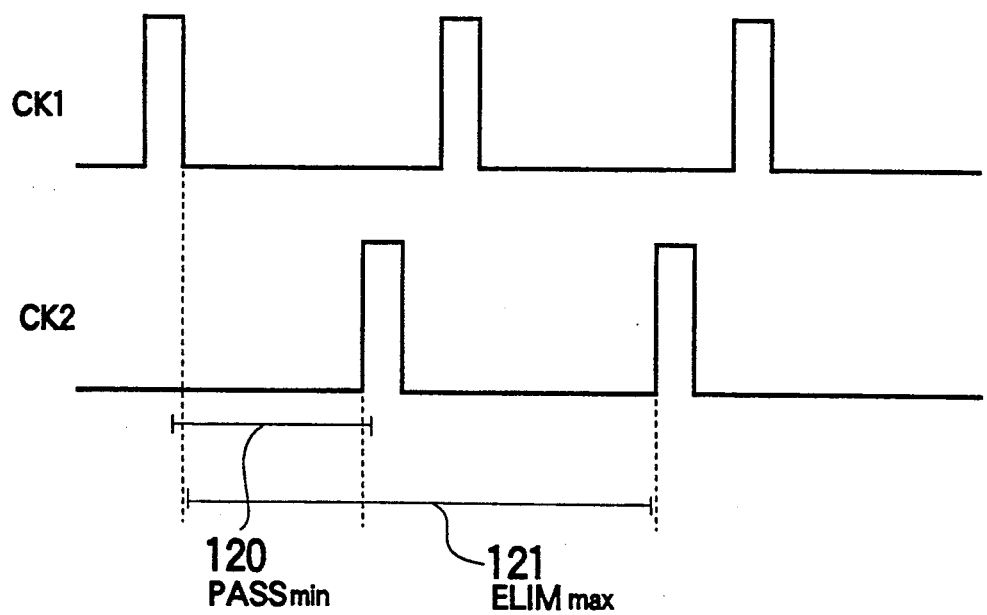
Figure 4:
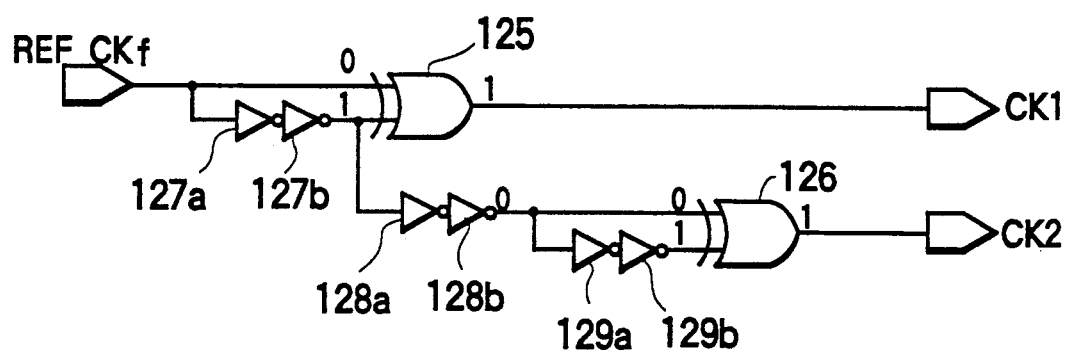

Further, it is also possible to explain that the maximum pulse (noise) eliminate time (period) $ELIM_{max}$ is a double period of the shift clock $CK_s$ and a minimum pulse (signal) pass time $PASS_{min}$ is a period of the shift clock $CK_s$. Therefore, an input signal having a pulse width wider than a double period of the clock can be transmitted; an input signal having a pulse width narrower than a period of the clock can be eliminated; and an input signal having a pulse width between a double period and a single period of the clock can be transmitted or eliminated according to a difference in time between the input signal IN and the clock $CK_s$, as depicted in FIG. 4(c).

For example, the assumption is made that when the output signal level OUT 2 is at "0", a signal is generated and propagated during which the input signal level IN is at "1". In this case, if the up-edge of the shift clock $CK_s$ exists once as shown by 301 in FIG. 3(B), a change in an input signal level is not propagated and therefore noise signals can be eliminated. However, if the up-edge of the shift clock $CK_s$ exists twice as shown by 302 in FIG. 3(B), a change in an input signal is propagated at the second time of the up-edge of the shift clock $CK_s$.

However, when the input signal (IN) level is returned to the same output signal (OUT 2) level ("0") at A1 in FIG. 3(B), before the output signal (OUT 1) level is shifted by the second D-FF 202, the D-FFs 201 and 202 are both reset to "0" via the NOR gate 204 at the time of the down-edge of the input signal IN, so that the output signal (OUT 2) level will not change.

In contrast, the assumption is made that when the output signal level OUT 2 is at "1", a signal is generated and propagated during which the input signal level IN is at "0". In this case, if the up-edge of the shift clock $CK_s$ exists once as shown by 303 in FIG. 3(B), a change in an input signal level is not propagated and therefore noise can be eliminated. However, if the up-edge of the shift clock $CK_s$ exists twice as shown by 304 in FIG. 3(B), a change in an input signal level is propagated at the second time of the up-edge of the shift clock $CK_s$.

However, when the input signal (IN) level is returned to the same output signal (OUT 2) level "1" at $A_2$ in FIG. 3(B) before the output signal (OUT 1) level is shifted by the second D-FF 202, the D-FFs 201 and 202 are both set to "1" via the AND gate 203 at the time of the up-edge of the input signal IN, so that the output signal (OUT 2) level will not change.

As described above, in the first embodiment, the noise signal eliminate time can be determined on the basis of the period or frequency of the shift clock. In addition, it is possible to always eliminate noise, irrespective of the "1" or "0" level of the output signal OUT 2, because an input signal (e.g. noise) having a level "1" or "0" opposite to that of the output signal OUT 2 can be eliminated. Further, since the noise eliminator is configured by only digital circuits without use of any analog circuit, it is possible to improve the test efficiency, in particular when the noise eliminator is integrated into a single chip together with other circuits. This is because in the case of an analog circuit the testing method must be modified according to kinds of the analog circuits and therefore the test process becomes complicated.

FIG. 4(A) shows a second embodiment configured by a dynamic-operation set/reset shift register according to the present invention. Here, dynamic operation implies a digital circuit activated by clock pulses at regular time intervals to maintain the operation thereof without use of any flip-flop circuits (static circuits). For instance, although signal levels can be stored at the input gate of a MOS inverter or by changing a capacitor formed between a node and the substrate, the stored signal must be transferred to the next stage in response to clock pulses, before having been discharged.

In more detail, the noise eliminator comprises a dynamic set/reset shift register composed of a first transmission gate 105, a second transmission gate 106, and a shift inverter 113, a set/reset (charge/discharge) circuit 115 composed of a first p-channel MOS FET 110, a second P-channel MOS FET 109, a first N-channel MOS FET 111 and a second N-channel MOS FET 112 and having an input node 117 between the first transmission gate 105 and the shift inverter 113 and an output node 114 connected between the shift inverter 113 and the second transmission gate 106, a first input-side inventor 104, and a second output-side inverter 107.

The first transmission gate 105 is switched in response to a first clock $CK_1$, and the second transmission gate 106 is switched in response to a second clock CK2. The first P-channel MOS FET 110 is turned on in response to a "0" level signal obtained by inverting an input signal (IN) level "1" via the first input-side inverter 104; the first N-channel MOS FET 111 is turned on in response to a "1" level signal obtained by inverting an input signal (IN) level "0" via the first input-side inverter 104. The second P-channel MOS FET 109 is turned on in response to a "0" level signal at the node 116 between the second transmission gate 106 and the output-side inverter 107; and the second N-channel MOS FET 112 is turned on in response to a "1" level at the same node 116. Therefore, the first and second P-channel MOS FETs 110 and 109 are both turned on to set the node 117 when the input and output signals are both at "1" as shown in FIG. 4(A). However, the first and second N-channel MOS FETs 111 and 112 are both turned on to reset the node 117 when the input and output signals are both at "0".

With reference to FIG. 4(B), the operation of the dynamic noise eliminator shown FIG. 4(A) will be described. In the noise eliminator composed of two transmission gates 105 and 106, since the input signal IN is delayed by a time difference between two up-edges of two clocks CK1 and CK2, it is possible to pass a signal having a period or a pulse width wider than a time difference $ELIM_{max}$ (121) between a down-edge of the first clock CK1 and a second-occurrence up-edge of the second clock CK2, but to eliminate a signal having a period or a pulse width narrower than a time difference $PASS_{min}$ (120) between a down-edge of the first clock CK1 and a first-occurrence up-edge of the second clock CK2. Further, a signal having a period or a pulse width between the two time differences $PASS_{min}$ and $ELIM_{max}$ may be passed or eliminated according to the relative time of the input signal and the clocks.

In more detail, when an input signal (IN) level changes from "0" to "1" at $B_1$ in FIG. 4(B) and thereafter the first clock CK1 rises to "1" at $B_2$, only the first transmission gate 105 is turned on and therefore the node 114 drops to "0"; however, since the second transmission gate 106 is not yet turned on, only the first P-channel MOS FET 110 is turned on and the other MOS FETs are kept turned off. That is, since the set/reset (charge/discharge) circuit 115 is not connected to the node 117, the output signal (OUT) level is kept unchanged. Thereafter, when the second clock CK2 rises to "1" at $B_3$, since the second transmission gate 106 is turned on, so that the output signal (OUT) level 108 changes to "1" via the output-side inverter 107. Under these conditions, since the second P-channel MOS FET 109 is turned on (the first P-channel MOS FET 110 is kept turned on), the node 117 is set or changed to "1" via the two P-channel MOS FETs 110 and 109.

Under these condition, when the input signal (IN) level and the second clock CK2 both drop to "0" at B4, since only the first N-channel MOS FET 111 is turned on, the set/reset circuit 115 is not connected to the node 117, so that the node (114) level and the output signal (OUT) level are kept unchanged.

Thereafter, when the first clock CK1 rises at B5 after the input signal (IN) level drops to "0", since the first transmission gate 105 is turned on, the node 114 is changed to "1" via the shift inverter 113. However, since the second transmission gate 106 is turned off, even if only the first N-channel MOS FET 111 is turned on, the set/reset circuit 115 is not connected to the node 117, so that the output signal (OUT) level is kept unchanged at "1".

Under these condition, however, when the second cock CK2 rises to "1" at B6, since the second transmission gate 106 is turned on, the node 116 is changed to "1" to turn the second N-channel MOS FET 112 (the first N-channel MOS FET 111 is kept turned on), so that the node 117 is reset or changed to "0" and therefore the output signal (OUT) level is changed to "0" via the output-side inverter 107.

When the input signal (IN) leve changes from "0" to "1" at B7 and thereafter the second clock CK2 rises to "1" at B8, although the first P-channel MOS FET 110 is turned on and the first N-channel MOS FET 111 are turned off, since the second P-channel MOS FET 109 is turned off and the second N-channel MOS FET 112 are turned on (because the node 114 is at "1"), the set/reset circuit 115 is not connected, so that the node 114 is kept unchanged at "1"and therefore the output signal (OUT) level is also kept unchanged at "1".

Further, when the first clock CK1 rises to "1" at B9, since the input signal (IN) level is at "1" and the first transmission gate 105 is turned on, the node 114 is changed to "0" via the shift inverter 114. However, when the input signal (IN) level changes "1"to "0" at $B_{10}$, the node 114 also changes to "1" via the shift inverter 113.

Thereafter, when the second clock CK2 rises to "1" at $B_{11}$, since the input signal (IN) level is at "0", the conditions are the same at $B_6$, so that the output level OUT is reset to "0".

In summary, a change in the input signal (IN) level between a down-edge of the first clock CK1 and an up-edge of the second-occurrence of the second clock CK2 as shown by $ELIM_{max}$ (121) can be transmitted to the output terminal OUT. Further, a change in input signal (IN) level between a down-edge of the first clock CK1 and an up-edge of the first-occurrence of the second clock CK2 as shown by $PASS_{min}$ (120) cannot be transmitted to the output terminal OUT. Therefore, the noise elimination time is determined in dependence upon the timings of the input signal (IN) and the first clock signal CK1.

FIG. 4(C) shows a relationship between the circuit pass/eliminate characteristics and the input pulse signal pulse width. FIG. 4(C) indicates that, when the input pulse width is wider than the maximum pulse eliminate time $ELIM_{max}$ (121) at a range designated by 124, the input pulse signal can be passed or transmitted; when the pulse width is narrower than the minimum pulse pass time $PASS_{min}$ (120) at a range designated by 122, the input pulse signal will not be passed or transmitted so that noise signal can be eliminated; and when the pulse width lies between the two $PASS_{min}$ and $ELIM_{max}$ at a range designated by 123, the pulse signal is passed or not passed under unstable conditions.

In order to increase the noise elimination time or to reduce the above-mentioned unstable range 123, it is preferable to increase the time period (120) between the down-edge of the first clock CK1 and the up-edge of the second clock CK2 as long as possible, as shown in FIG. 4(D), because the range 123 between the pulse pass range 124 and the pulse eliminate range 122 can be reduced relative to the above-mentioned time period 120. FIG. 4(E) shows an example of circuit for decreasing the unstable range 123, that is, for delaying the second clock CL2 from the first clock CK1 which is configured by first and second exclusive-OR gates 125 and 126 and six inverters 127a, 127b, 128a, 128b, and 129a and 129b. In an exclusive OR gate, a "1" level signal can be obtained when two input signal levels are different from each other. Therefore, when a reference clock $CK_f$ is delayed via two series-connected inverters due to change-up time at the input gate of each inverter, it is possible to obtain a delayed "1" level signal through an exclusive-OR gate in response to the same reference clock directly applied to one input terminal thereof and indirectly applied to the other input terminal thereof via the two series-connected inverters with delay.

Figure 5:
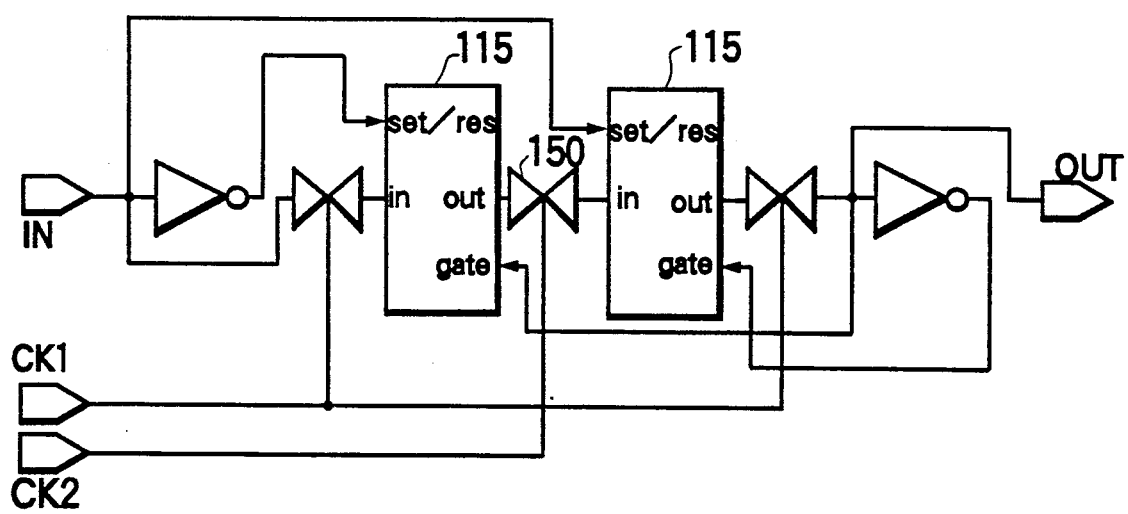
FIG. 5(A) is a third embodiment of the digital noise eliminator according to the present invention.
FIG. 5(B) is a timing chart for assistance in explaining pulse pass and elimination times of the third embodiment shown in FIG. 5(A)
FIG. 5(C) is a timing chart for assistance in explaining the pulse pass and elimination times of another modification of the third embodiment of the digital noise eliminator shown in FIG. 5(A).
Figure 5:
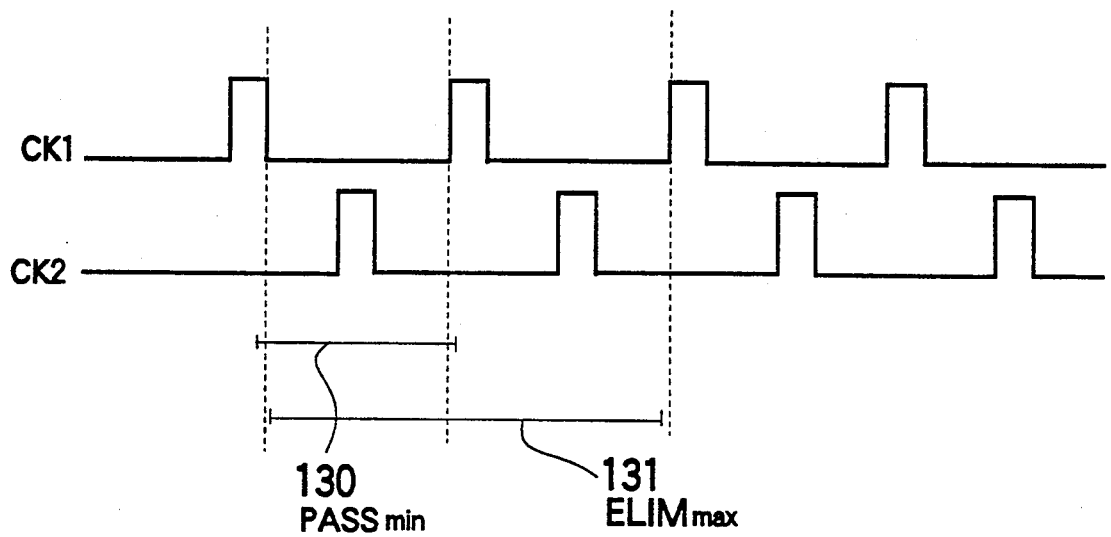
Figure 5:
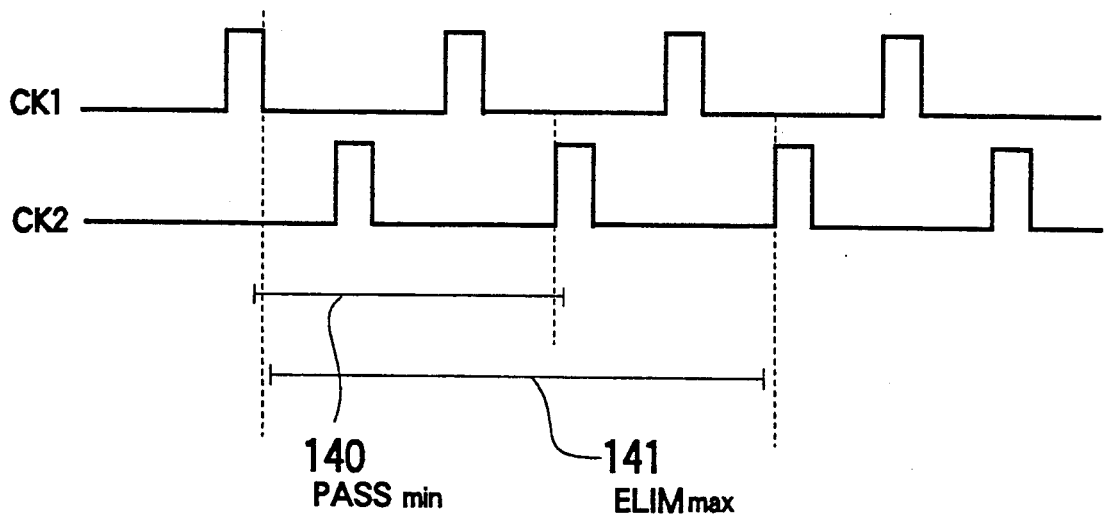

FIG. 5(A) shows a third embodiment of the present invention, in which two set/rest (charge/discharge) shift registers 115 composed of first and second P-channel MOS FETs 110 and 109, first and second N-channel MOS FETs 111 and 112, and a shift inverter 113 are connected in series with another transmission gate 150 interposed therebetween. FIG. 5(B) shows a minimum pulse pass time $PASS_{min}$ (130) and a maximum pulse eliminate time $ELIM_{max}$ (131) of the noise eliminator shown in FIG. 5(A), in which the $PASS_{min}$ and $ELIM_{max}$ times 130 and 131 are both determined only in dependence upon the first clock signal CK1.

Further, when another set/reset (charge/discharge) shift register 115 composed of the MOS FETs 109, 110, 111 and 112 and the inverter 113 is additionally connected in series to the circuit shown in FIG. 5(A)(three circuits 115 in total), The minimum pulse pass time $PASS_{min}$ (140) and the maximum pulse eliminate time $ELIM_{max}$ (141) of the noise eliminator are determined as shown in FIG. 5(C).

The unstable noise elimination time 123 shown in FIG. 4(C) is produced due to a difference in timing between the input signal IN and the first clock CK1 at its maximum, irrespective of the number of stages of the shift registers, as shown in FIGS. 4(D), 5(B) and 5(C). However, when the shift registers are connected in series in multistage, it is possible to reduce the chance that the difference in timing between the input signal IN and the first clock CK1 becomes its maximum at all the stages, thus being possible to reduce the unstable noise elimination time 123 in practice.

When the noise eliminator is formed into a multistage, although the number of shift circuits is increased, since the shift circuits can be formed by dynamic circuits controllable in response to clock signals, it is possible to reduce the volume of each element and therefore to integrate the noise eliminator at a small area within an IC chip when incorporated in other circuits. Further, since the first and second clocks CK1 and CK2 can be generated, on the basis of a reference clock generated by a clock generator, by a simple circuit as shown in FIG. 4(E), even if a plurality of noise eliminators are incorporated within a single IC chip, it is possible to use the clock generator in common, without increasing the IC volume markedly for the noise eliminators.

Further, the concept of the digital noise eliminator according to the present invention can be expanded as follows:

The shift means transmits an input signal IN only when N-pieces (N>2)=of edges of the clock CK are included in the same state period of the input signal at an N-th edge timing of the clock as an output signal OUT, in order to eliminate the input signal as a noise signal, when only (N-1)-pieces of edges of clock are included in the same state period of the input signal.

As described above, in the digital noise eliminator according to the present invention, since the noise elimination time can be determined in dependence upon shift timing of at least one shift register, it is possible to precisely determine the noise elimination time on the basis of a reference clock. Further when the noise eliminator is formed into the dynamic type, it is possible to minimize the IC volume. Therefore, the noise eliminator of the present invention is effectively applicable to a multicommunications system (the transmission rate being more than several tens kHz) for automotive vehicles in which various noise signals higher than several hundreds kHz are always generated, without practically increasing the manufacturing cost thereof.

What is claimed is:
1. A digital noise eliminator, comprising:
 (a) clock generating means for generating a first clock and a second clock delayed in time with respect to said first clock;
 (b) shift means, responsive to an input signal, for selectively transmitting said input signal as an output signal or eliminting said input signal as a noise signal, said shift means comprising
  (1) a first transmission gate responsive to said input signal and said first clock, said first transmission gate being turned on in response to said first clock,

(2) a second transmission gate, responsive to said second clock, said second transmission gate being turned on in response to said second clock, (3) a shift inverter, connected between said first transmission gate and said second transmission gate, for inverting a binary signal level of a signal inputted to said shift inverter;

(c) set means, responsive to said input signal and to said output signal, for setting said shift means when a binary level of said input signal and a binary level of said output signal are both at a first binary signal level; and (d) reset means, responsive to said input signal and to said output signal, for resetting said shift means when a binary level of said input signal and a binary level of said output signal are both at a second binary signal level;

(e) said clock generating means activating said shift means on the basis of a time delay between said first and second clocks in such a way that said shift means transmits said input signal when said input signal has a pulse width wider then a time duration between a down-edge of said first clock and a second-occurrence up-edge of said second clock, eliminates said input signal when said input signal has a pulse width narrower than a time duration between a down-edge of said first clock and a first-occurrence up-edge of said second clock, and transmits or eliminates said input signal when said input signal has a pulse width equal to a time duration extending from a down-edge of said first clock to a time between two next occurring up-edges of said second clock.

2. A digital noise eliminator, comprising:

(a) shift means, responsive to an input signal, for selectively transmitting said input signal as an output signal or eliminating said input signal as a noise signal, said shift means comprising (1) a first transmission gate responsive to said input signal and a first clock, said first transmission gate being turned on in response to said first clock,

(23) a second transmission gate, responsive to a second clock, said second transmission gate being turned on in response to said second clock, said second clock being delayed in time with respect to said first clock, and (3) a shift inverter, connected between said first transmission gate and said second transmission gate, for inverting a binary signal level of a signal inputted to said shift inverter;

(b) set means, responsive to said input signal and to said output signal, for setting said shift means when a binary level of said input signal and a binary level of said output signal are both at a first binary signal level, said set means comprising (1) an input-side inverter, responsive to said input signal, for inverting a level of said input signal;

(2) a first switching element having an output terminal connected between said first transmission gate and said shift inverter and turned on in response to a first binary voltage level of said input signal inverted by said input-side inverter, and (3) a second switching element connected between said first switching element and a supply voltage and turned on in response to said first binary voltage level of said input signal inverted by said shift inverter when said first and second transmission gates are both turned on simultaneously in response to said first and second clocks, said first and second switching elements setting an output terminal of said first transmission gate at a high-voltage level when both said first and second switching elements are turned on; and (c) reset means, responsive to said input signal and to said output signal, for resetting said shift means when a binary level of said input signal and a binary level of said output signal are both at a second binary signal level.

3. A digital noise eliminator, comprising:

(a) shift means, responsive to an input signal, for selectively transmitting said input signal as an output signal or eliminating said input signal as a noise signal, said shift means comprising (1) a first transmission gate responsive to said input signal and a first clock, said first transmission gate being turned on in responses to said first clock, (2) a second transmission gate, responsive to a second clock, said second transmission gate being turned on in response to said second clock, said second clock being delayed in time with respect to said first clock, (3) a shift inverter, connected between said first transmission gate and said second transmission gate, for inverting a binary signal level of a signal inputted to said shift inverter;

(b) set means, responsive to said input signal and to said output signal, for setting said shift means when a binary level of said input signal and a binary level of said output signal are both at a first binary signal level;

(c) reset means, responsive to said input signal and to said output signal, for resetting said shift means when a binary level of said input signal and a binary level of said output signal are both at a second binary signal level; and (d) a clock generator comprising (1) a first exclusive OR gate having a first input terminal responsive to a reference clock and a second input terminal connected to said reference clock by two series-connected inverters, for generating said first clock, and (2) a second exclusive OR gate having a first input terminal connected to said second input terminal of said first exclusive OR gate by two other series-connected ivnerters and a second input terminal connected to said first input terminal of said second exclusive OR gate via two further series-connected inverters, for generating said second clock with a delay from said first clock.

4. The digital noise eliminator of claim 2 wherein said reset means comprises:

(a) a third switching element having an output terminal connected between said first transmission gate and said shift inverter and turned on in response to a second binary voltage level of said input signal inverted by said input-side inverter; and (b) a fourth switching element connected between said third switching element and ground and turned on in response to said second binary voltage level of said input signal inverted by said shift inverter when said first and second transmission gates are both turned on simultaneously in response to said first and second clocks, said third and fourth switching elements resetting said output terminal of said first transmission gate at a low-voltage level when both said third and fourth switching elements are turned on.

5. The digital noise eliminator of claim 4, wherein a plurality of set-reset shift registers each including said shift inverter and said first to fourth switching elements are connected in a multistage mode between two of at least three transmission gates, respectively.

6. The digital noise eliminateor of claim 4, further including:

at least one additional transmission gate connected in series with said first and second transmission gates; and a plurality of set-reset shift registers connected in a multistage mode with each shift register of said plurality being connected between two of said transmission gates, one shift register of said plurality including said shift inverter and said first to fourth switching elements and each remaining shift register of said plurality including a further shift inverter and four switching elements respectively connected and operative as said shift register first recited and said first to fourth switching elements.

* * * * *